(12) United States Patent
Kato et al.

(10) Patent No.: US 10,186,346 B2
(45) Date of Patent: Jan. 22, 2019

(54) TRANSPARENT CONDUCTIVE FILM

(71) Applicant: NITTO DENKO CORPORATION, Ibaraki-shi, Osaka (JP)

(72) Inventors: Daiki Kato, Osaka (JP); Rie Kawakami, Osaka (JP); Nozomi Fujino, Osaka (JP); Tomotake Nashiki, Osaka (JP)

(73) Assignee: NITTO DENKO CORPORATION, Ibaraki-shi, Osaka (JP)

( * ) Notice: Subject to any disclaimer, the term of this patent is extended or adjusted under 35 U.S.C. 154(b) by 62 days.

(21) Appl. No.: 15/037,288

(22) PCT Filed: Mar. 11, 2015

(86) PCT No.: PCT/JP2015/057213
§ 371 (c)(1),
(2) Date: May 17, 2016

(87) PCT Pub. No.: WO2015/166724
PCT Pub. Date: Nov. 5, 2015

(65) Prior Publication Data
US 2017/0047144 A1 Feb. 16, 2017

(30) Foreign Application Priority Data

Apr. 30, 2014 (JP) .................. 2014-093487
May 20, 2014 (JP) .................. 2014-104184
May 20, 2014 (JP) .................. 2014-104609

(51) Int. Cl.
*H01B 5/14* (2006.01)
*B32B 7/02* (2006.01)
(Continued)

(52) U.S. Cl.
CPC .................. *H01B 5/14* (2013.01); *B32B 7/02* (2013.01); *C23C 14/086* (2013.01); *C23C 14/10* (2013.01);
(Continued)

(58) Field of Classification Search
CPC .......... H01B 3/10; H01B 3/442; H01B 3/423; H01B 3/426–3/427; H01B 3/305–3/307;
(Continued)

(56) References Cited

U.S. PATENT DOCUMENTS 6,727,566 B1 * 4/2004 Fukui .................. B32B 7/02
257/437
2005/0170158 A1 * 8/2005 Hattori .................. B32B 7/00
428/212
(Continued)

FOREIGN PATENT DOCUMENTS

CN 1795516 A 6/2006
CN 103632755 A 3/2014
(Continued)

OTHER PUBLICATIONS

"Technical Note: Abbe's Number and Refractive Index of Transparent Films and Sheets". Mitsui Chemical Analysis & Consulting Service, Inc. Retrieved Mar. 13, 2018.*
(Continued)

*Primary Examiner* — Prashant J Khatri
(74) *Attorney, Agent, or Firm* — Westerman, Hattori, Daniels & Adrian, LLP (57) ABSTRACT

A transparent conductive film 1 includes, in this order, a transparent substrate 2, a first optical adjustment layer 4, an inorganic layer 5, and a transparent conductive layer 6. The first optical adjustment layer 4 has refractive index nC lower than refractive index nA of the transparent substrate 2, and thickness TC of 10 nm or more and 35 nm or less. The
(Continued)

inorganic layer 5 has refractive index nD that is lower than the absolute value |nC×1.13| of a value obtained by multiplying the refractive index nC of the first optical adjustment layer 4 by 1.13.

6 Claims, 2 Drawing Sheets

(51) Int. Cl.
| | |
|---|---|
| C23C 14/10 | (2006.01) |
| H01B 3/10 | (2006.01) |
| H01B 3/30 | (2006.01) |
| H01B 3/38 | (2006.01) |
| H01B 3/42 | (2006.01) |
| H01B 3/44 | (2006.01) |
| C23C 14/08 | (2006.01) |
| G06F 3/041 | (2006.01) |

(52) U.S. Cl.
CPC .............. *H01B 3/10* (2013.01); *H01B 3/301* (2013.01); *H01B 3/305* (2013.01); *H01B 3/306* (2013.01); *H01B 3/307* (2013.01); *H01B 3/38* (2013.01); *H01B 3/423* (2013.01); *H01B 3/426* (2013.01); *H01B 3/427* (2013.01); *H01B 3/442* (2013.01); *H01B 3/447* (2013.01); *G06F 3/041* (2013.01); *Y10T 428/24975* (2015.01); *Y10T 428/265* (2015.01)

(58) Field of Classification Search
CPC .......... H01B 3/301; H01B 3/38; H01B 3/447; H01B 5/14; G06F 1/00–1/3296; G06F 3/00–3/167
See application file for complete search history.

(56) References Cited

U.S. PATENT DOCUMENTS

| | | | |
|---|---|---|---|
| 2006/0285213 A1 | 12/2006 | Kanda et al. | |
| 2008/0138589 A1 | 6/2008 | Wakabayashi et al. | |
| 2008/0166551 A1 | 7/2008 | Sasa et al. | |
| 2008/0176042 A1* | 7/2008 | Nashiki | G06F 3/044 428/172 |
| 2010/0015417 A1 | 1/2010 | Nakajima et al. | |
| 2011/0212305 A1* | 9/2011 | Chen | G02B 1/116 428/172 |
| 2012/0181063 A1 | 7/2012 | Nakajima et al. | |
| 2012/0200928 A1 | 8/2012 | Kim et al. | |
| 2013/0095308 A1* | 4/2013 | Kim | G06F 3/044 428/213 |
| 2013/0213703 A1* | 8/2013 | Kawaguchi | C23C 14/0042 174/257 |
| 2013/0280554 A1 | 10/2013 | Yamazaki et al. | |
| 2013/0288047 A1 | 10/2013 | Kajihara et al. | |
| 2014/0345917 A1 | 11/2014 | Takada et al. | |
| 2014/0353140 A1 | 12/2014 | Haishi et al. | |

FOREIGN PATENT DOCUMENTS

| | | |
|---|---|---|
| JP | 2002-371355 A | 12/2002 |
| JP | 2006-202756 A | 8/2006 |
| JP | 2010-27294 A | 2/2010 |
| JP | 2011-076932 A | 4/2011 |
| JP | 2012-134085 A | 7/2012 |
| JP | 2012-150779 A | 8/2012 |
| JP | 2012-203701 A | 10/2012 |
| JP | 2013-8099 A | 1/2013 |
| JP | 2013-507682 A | 3/2013 |
| JP | 2014-73614 A | 4/2014 |
| JP | 2014-96241 A | 5/2014 |
| JP | 5637327 B1 | 12/2014 |
| JP | 2015-005272 A | 1/2015 |
| JP | 5683734 B1 | 3/2015 |
| WO | 2006/126604 A1 | 11/2006 |
| WO | 2013/080995 A1 | 6/2013 |
| WO | 2014/080742 A1 | 5/2014 |

OTHER PUBLICATIONS

International Search Report dated Jun. 2, 2015, issued in counterpart International Application No. PCT/JP2015/057213 (2 pages).
Written Opinion dated Jun. 2, 2015, issued in counterpart Application No. PCT/JP2015/057213 (4 pages).
Notice of Reasons for Refusal dated Jun. 21, 2016, issued in counterpart Japanese Application No. 2016-506928, with English Translation. (6 pages).
Notification of Reasons for Refusal, dated Apr. 1, 2016, issued in counterpart Japanese Patent Application No. 2016-506928, with English translation. ( pages).
Second and Supplementary Notice Informing the Applicant of the Communication of the International Application (Form PCT/IB/308) dated Sep. 1, 2016, issued in counterpart International Application No. PCT/JP2015/057213. (1 page).
Notification Concerning Transmittal of Translation of the International Preliminary Report on Patentability (Form PCT/IB/326) issued in counterpart International Application No. PCT/JP2015/057213 dated Nov. 10, 2016, with Forms PCT/IB/373, PCT/IB/338, and PCT/ISA/237. (18 pages).
Office Action, dated Oct. 10, 2018, issued in counterpart Chinese Patent Application No. 201580002254.X (w/ English translation; 15 pages).
Office Action, dated Nov. 14, 2018, issued in counterpart Taiwanese Patent Application No. 104113431 (w/ English translation; 11 pages).

\* cited by examiner

TRANSPARENT CONDUCTIVE FILM

TECHNICAL FIELD

The present invention relates to a transparent conductive film, in particular, to a transparent conductive film used for, for example, films for a touch panel.

BACKGROUND ART

It is known that conventionally, a transparent conductive film including a transparent conductive layer having a predetermined pattern shape is used for a display portion of a touch panel.

For example, Patent Document 1 has proposed a transparent conductive film including a first transparent dielectric layer, a second transparent dielectric layer, and a patterned transparent conductive layer formed on one side or both sides of a transparent film substrate in this order.

The transparent conductive film of Patent Document 1 has good appearance because differences between the transparent the conductive layer pattern portion and the pattern opening portion are suppressed.

CITATION LIST

Patent Document

Patent Document 1: Japanese Unexamined Patent Publication No. 2010-27294

SUMMARY OF THE INVENTION

Problem to be Solved by the Invention

However, the transparent conductive film described in Patent Document 1 is disadvantageous in that the transparent conductive layer easily cracks.

An object of the present invention is to provide a transparent conductive film that achieves reduction in wiring pattern visibility and damages in transparent conductive layer.

Means for Solving the Problem

A transparent conductive film of the present invention includes, in this order, a transparent substrate, a first optical adjustment layer, an inorganic layer, and a transparent conductive layer, wherein the first optical adjustment layer has a refractive index lower than the refractive index of the transparent substrate and has a thickness of 10 nm or more and 35 nm or less, and the inorganic layer has a refractive index, the refractive index being lower than or the same as the absolute value of a value obtained by multiplying the refractive index of the first optical adjustment layer by 1.13.

The transparent conductive film has a first optical adjustment layer having predetermined refractive index and thickness, and an inorganic layer having a predetermined refractive index, and therefore damages to the transparent conductive layer can be suppressed, wiring pattern visibility can be suppressed, and excellent abrasion resistance and excellent transparency can be achieved.

It is preferable that the transparent conductive film of the present invention further includes a second optical adjustment layer disposed between the transparent substrate and the first optical adjustment layer, wherein the second optical adjustment layer has a refractive index higher than the refractive index of the transparent substrate.

The transparent conductive film achieves further suppression of wiring pattern visibility, and has more excellent abrasion resistance.

In the transparent conductive film of the present invention, it is preferable that the second optical adjustment layer has a thickness of 100 nm or more and 300 nm or less.

The transparent conductive film includes a first optical adjustment layer having a thickness within the above-described predetermined range, and therefore wiring pattern visibility can be further suppressed, and more excellent abrasion resistance can be achieved.

In the transparent conductive film of the present invention, it is preferable that the inorganic layer has a thickness of 1.5 nm or more and 10 nm or less.

The transparent conductive film includes an inorganic layer having a thickness within a predetermined range, and therefore damages to the transparent conductive layer can be suppressed even more.

In the transparent conductive film of the present invention, it is preferable that the transparent conductive layer has a thickness of 25 nm or more.

When the transparent conductive layer has a thickness of the above-described predetermined value or more, damages to the transparent conductive layer are easily caused. However, the transparent conductive film of the present invention includes the above-described first optical adjustment layer and inorganic layer, and therefore the above-described damages to the transparent conductive layer can be effectively suppressed.

In the transparent conductive film of the present invention, it is preferable that the first optical adjustment layer consists of resin.

The transparent conductive film has a first optical adjustment layer composed only of resin, and therefore the above-described damages to the transparent conductive layer can be effectively suppressed.

Effect of the Invention

The transparent conductive film of the present invention allows for suppression of damages to the transparent conductive layer, suppression of wiring pattern visibility, and excellent abrasion resistance and excellent transparency.

DESCRIPTION OF EMBODIMENTS

First Embodiment

Figure 1:
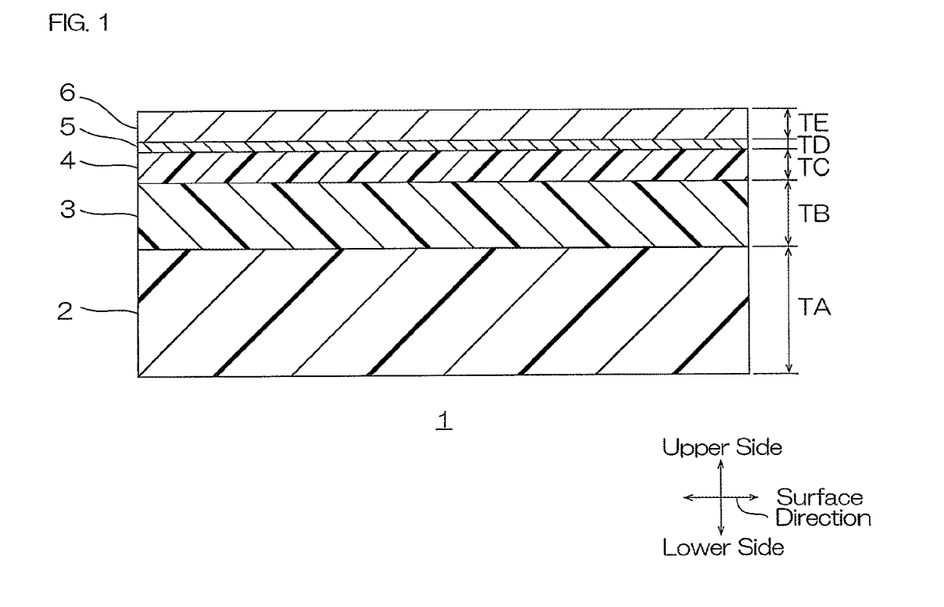
FIG. 1 shows a cross-sectional view of the transparent conductive film of the present invention in the first embodiment (embodiment in which a second optical adjustment layer is included).

In FIG. 1, up-down direction on the plane of the sheet is up-down direction (an example of thickness direction, first direction), upper side on the plane of the sheet is upper side (one side in the thickness direction, one side in the first direction), lower side on the plane of the sheet is lower side (the other side in the thickness direction, the other side in the first direction). To be specific, directions are in conformity with direction arrows in Figures.

1. Transparent Conductive Film

The transparent conductive film 1 has a film form (including sheet form) having a predetermined thickness, extends in a predetermined direction (surface direction) perpendicular to the thickness direction, and has a flat upper face and flat lower face. The transparent conductive film 1 is a component, for example, a substrate for a touch panel included in an image display device, that is, not an image display device. That is, the transparent conductive film 1 is a component for producing, for example, an image display device, does not include an image display element such as an LCD module, is distributed solely as a component, and is an industrially applicable device.

To be specific, as shown in FIG. 1, the transparent conductive film 1 includes a transparent substrate 2, a second optical adjustment layer 3 disposed on the transparent substrate 2, a first optical adjustment layer 4 disposed on the second optical adjustment layer 3, an inorganic layer 5 disposed on the first optical adjustment layer 4, and a transparent conductive layer 6 disposed on the inorganic layer 5. That is, in the transparent conductive film 1, the second optical adjustment layer 3, the first optical adjustment layer 4, the inorganic layer 5, and the transparent conductive layer 6 are disposed in this order on the transparent substrate 2.

The transparent conductive film 1 consists, preferably, of the transparent substrate 2, the second optical adjustment layer 3, the first optical adjustment layer 4, the inorganic layer 5, and the transparent conductive layer 6. Each of the layers is described below.

2. Transparent Substrate

The transparent substrate 2 is the lowermost layer of the transparent conductive film 1, and is a support material for ensuring mechanical strength of the transparent conductive film 1. The transparent substrate 2 supports the transparent conductive layer 6, along with the second optical adjustment layer 3, first optical adjustment layer 4, and inorganic layer 5.

The transparent substrate 2 is, for example, a polymer film having transparency. Examples of the polymer film material include polyester resin such as polyethylene terephthalate (PET), polybutylene terephthalate, and polyethylenenaphthalate; (meth) acrylic resin (acrylic resin and/or methacrylic resin) such as polymethacrylate; olefin resin such as polyethylene, polypropylene, and cycloolefin polymer; polycarbonate resin, polyethersulfone resin, polyarylate resin, melamine resin, polyamide resin, polyimide resin, cellulose resin, polystyrene resin, and norbornene resin. These polymer films can be used singly, or can be used in a combination of two or more. In view of transparency, heat resistance, and mechanical properties, preferably, polyester resin is used, and more preferably, PET is used.

The transparent substrate 2 has refractive index nA of, for example, 1.45 or more, preferably 1.55 or more, and for example, 1.80 or less, preferably 1.70 or less. The refractive index nA of the transparent substrate 2 is measured, for example, by Abbe refractometer.

The transparent substrate 2 has thickness TA of, for example, 2 μm or more, preferably 20 μm or more, and for example, 200 μm or less, preferably 150 μm or less, in view of mechanical strength, abrasion resistance, and input characteristics when the transparent conductive film 1 is used for a film for a touch panel.

On the lower face of the transparent substrate 2, as necessary, for example, a hard coat layer, a blocking prevention layer, an adhesion facilitation layer, an adhesive layer, and a separator can be provided.

3. Second Optical Adjustment Layer 3

Figure 2:
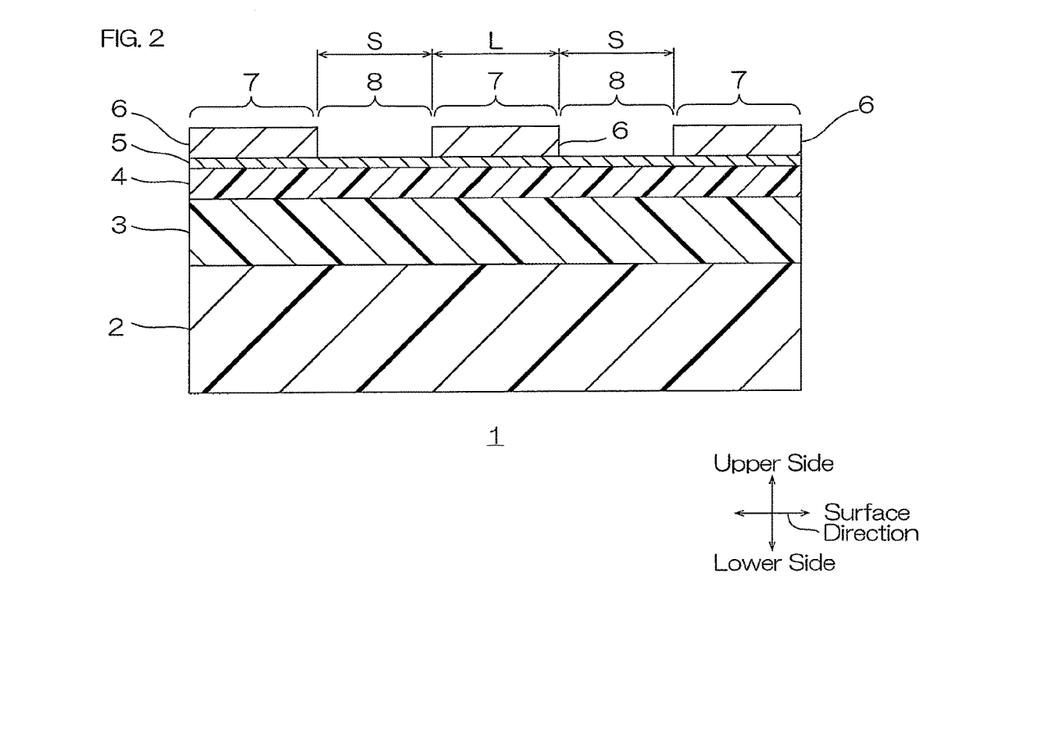
FIG. 2 shows a cross-sectional view of the transparent conductive film in the first embodiment, in which the transparent conductive layer is formed into a wiring pattern.

The second optical adjustment layer 3 is an optical adjustment layer that adjusts, along with the first optical adjustment layer 4 and the inorganic layer 5 to be described later, optical properties of the transparent conductive film 1 so as to avoid visibility of the differences between the pattern portion 7 and the non-pattern portion 8 after forming the transparent conductive layer 6 into a wiring pattern in later steps (that is, suppression of wiring pattern visibility), as shown in FIG. 2. The second optical adjustment layer 3 is also an abrasion protection layer for not causing scratches on the upper face (that is, surface of the transparent conductive film 1) of the transparent conductive layer 6 (that is, achieves excellent abrasion resistance).

The second optical adjustment layer 3 has a film form (including sheet form), and for example, is disposed on the entire upper face of the transparent substrate 2 so as to be in contact with the upper face of the transparent substrate 2.

The second optical adjustment layer 3 is prepared from a second optical composition.

The second optical composition contains, for example, resin. The second optical composition preferably contains resin and particles. The second optical composition consists, more preferably, only of resin and particles.

Examples of the resin include curable resin and thermoplastic resin (for example, polyolefin resin), and preferably, curable resin is used.

Examples of the curable resin include an active energy ray curable resin that is cured by application of an active energy ray (to be specific, ultraviolet ray, electron beam, etc.) and for example, a thermosetting resin that is cured by heat, and preferably, an active energy ray curable resin is used.

Examples of the active energy ray curable resin include a polymer having a functional group having a polymerizable carbon-carbon double bond in the molecule. Examples of such a functional group include a vinyl group, and a (meth) acryloyl group (methacryloyl group and/or acryloyl group).

Examples of the active energy ray curable resin include (meth)acrylic resin (acrylic resin and/or methacrylic resin) containing a functional group in its side chain.

These resins can be used singly, or can be used in a combination of two or more.

The resin content relative to the second optical composition is, for example, 50 mass % or more, preferably 40 mass % or more, and for example, 95 mass % or less, preferably 90 mass % or less.

Examples of the particles include inorganic particles and organic particles. Examples of the inorganic particles include silica particles (including hollow nanosilica particles), metal oxide particles composed of zirconium oxide and titanium oxide; and carbonate particles such as calcium carbonate. Examples of the organic particles include crosslinked acrylic resin particles.

For the particles, preferably, inorganic particles, more preferably, metal oxide particles, even more preferably, zirconium oxide particles ($ZnO_2$) are used.

The particles have an average particle size of, for example, 5 nm or more, preferably 10 nm or more, and for example, 500 nm or less, preferably 100 nm or less.

The average particle size of the particles can be measured by Coulter counting method using a Coulter Multisizer manufactured by Beckman Coulter, Inc.

The particles content relative to 100 parts by mass of the resin is, for example, 5 parts by mass or more, preferably 10 parts by mass or more, and for example, 100 parts by mass or less, preferably 65 parts by mass or less. The particles content relative to the second optical composition is, for example, 5 mass % or more, preferably 10 mass % or more, and for example, 50 mass % or less, preferably 40 mass % or less.

The second optical adjustment layer 3 has, for example, refractive index nB that is higher than refractive index nA of the transparent substrate 2. The refractive index nB of the second optical adjustment layer 3 is measured, for example, by Abbe refractometer.

Meanwhile, when the second optical adjustment layer 3 has refractive index nB of lower than or the same as the refractive index nA of the transparent substrate 2, optical properties of the transparent conductive film 1 (to be specific, suppression of wiring pattern visibility) may be reduced.

The ratio of refractive index nB of the second optical adjustment layer 3 relative to the refractive index nA of the transparent substrate 2 (nB/nA) is more than 1, preferably 1.01 or more, and more preferably 1.05 or more, and for example, 1.50 or less.

A value (difference nB-nA) obtained by subtracting the refractive index nA of the transparent substrate 2 from the refractive index nB of the second optical adjustment layer 3 is, for example, 0.01 or more, preferably 0.05 or more, and for example, 0.50 or less, preferably 0.20 or less.

To be specific, the second optical adjustment layer 3 has refractive index nB of, for example, 1.50 or more, preferably 1.60 or more, and for example, 1.80 or less, preferably 1.75 or less.

When the second optical adjustment layer 3 has refractive index nB, ratio (nB/nA), and/or difference (nB-nA) of more than the above-described lower limits, reduction in optical characteristics of the transparent conductive film 1 (to be specific, suppression of wiring pattern visibility) can be suppressed.

The second optical adjustment layer 3 has thickness TB of, for example, 100 nm or more, preferably 120 nm or more, more preferably 150 nm or more, even more preferably 180 nm or more, and for example, 300 nm or less, preferably 280 nm or less, more preferably 250 nm or less, even more preferably 220 nm or less, particularly preferably 200 nm or less. The thickness TB of the second optical adjustment layer 3 is measured, for example, by observation of cross sections with a transmission electron microscope (TEM).

The ratio (TB/TA) of the thickness TB of the second optical adjustment layer 3 relative to the thickness TA of the transparent substrate 2 is, for example, 0.0020 or more, preferably more than 0.0020, more preferably 0.0030 or more, and for example, less than 0.0070, preferably less than 0.0060, more preferably 0.0050 or less.

When the thickness TB of the second optical adjustment layer 3 and/or ratio (TB/TA) are the above-described lower limit or more, excellent abrasion resistance can be produced. Meanwhile, when the thickness TB of the second optical adjustment layer 3 is the above-described upper limit or less, wiring pattern visibility can be suppressed.

4. First Optical Adjustment Layer

The first optical adjustment layer 4 is an optical adjustment layer that adjusts optical properties of the transparent conductive film 1 for suppressing wiring pattern visibility in the transparent conductive layer 6 and ensuring excellent transparency in the transparent conductive film 1, along with the second optical adjustment layer 3 and the inorganic layer 5.

The first optical adjustment layer 4 has a film form (including sheet form), and for example, is disposed on the entire upper face of the second optical adjustment layer 3, so as to be in contact with the upper face of the second optical adjustment layer 3.

The first optical adjustment layer 4 is prepared from the first optical composition.

The first optical composition contains, for example, resin, and preferably, consists substantially of resin, and more preferably, consists of only resin. That is, the first optical composition (and first optical adjustment layer 4) preferably does not substantially contain particles.

The resin is selected from those resins given as examples of the second optical composition. For the resin, preferably, thermosetting resin is used.

Examples of the thermosetting resin include silicone resin, epoxy resin, urethane resin, polyimide resin, phenol resin, urea resin, melamine resin, and unsaturated polyester resin. Preferably, epoxy resin and melamine resin are used, more preferably, epoxy resin is used.

Examples of the epoxy resin include bisphenol epoxy resins such as bisphenol A, bisphenol F, and bisphenol S epoxy resins; novolak epoxy resins such as phenol novolak and cresol novolak epoxy resins; nitrogen-containing cyclic epoxy resins such as triglycidyl isocyanurate and hydantoin; naphthalene epoxy resin; biphenyl epoxy resin; glycidyl ether epoxy resin; dicyclo epoxy resin; ester epoxy resin; and modified products or hydrogenated products of these.

The epoxy resin can be blended with a curing agent, to be prepared as an epoxy resin composition containing epoxy resin and the curing agent. Examples of the curing agent include curing agents for epoxy resin such as a polyamine curing agent, amide curing agent, acid anhydride curing agent, dihydrazide curing agent, urea curing agent, imidazole curing agent, and imidazoline curing agent.

The mixing ratio of the curing agent relative to 100 parts by mass of the epoxy resin is, for example, 0.05 parts by mass or more, preferably 0.1 parts by mass or more, and for example, 3.0 parts by mass or less, preferably 1.0 parts by mass or less.

"Substantially does not contain particles" described as a suitable embodiment of the first optical composition means that superfine particles can be contained as impurity as particles, and in such a case, the particles content relative to the total solid of the first optical composition is, for example, less than 1 mass %, preferably less than 0.1 mass %.

Meanwhile, the first optical composition can contain, for example, resin and particles.

The particles are suitably selected, and preferably, silica particles are used.

The particles content relative to 100 parts by mass of the resin is, for example, 11 parts by mass or more, preferably 42 parts by mass or more, and for example, 150 parts by mass or less, preferably 110 parts by mass or less. The particles content relative to the first optical composition is, for example, 10 mass % or more, preferably 30 mass % or more, and for example, 60 mass % or less, preferably 55 mass % or less.

The first optical adjustment layer 4 has refractive index nC lower than the refractive index nA of the transparent substrate 2. The refractive index nC of the first optical adjustment layer 4 is measured by, for example, Abbe refractometer.

Meanwhile, when the refractive index nC of the first optical adjustment layer 4 is higher than or the same as the refractive index nA of the transparent substrate 2, optical characteristics of the transparent conductive film 1 (to be specific, suppression of wiring pattern visibility) are reduced.

The ratio of the refractive index nC of the first optical adjustment layer 4 relative to the refractive index nA of the transparent substrate 2 (nC/nA) is less than 1, preferably 0.99 or less, more preferably 0.95 or less, and for example, 0.80 or more.

The value (difference nA-nC) obtained by subtracting the refractive index nC of the first optical adjustment layer 4 from the refractive index nA of the transparent substrate 2 is, for example, 0.01 or more, preferably 0.05 or more, more preferably 0.10 or more, and for example, 0.30 or less, preferably 0.25 or less.

To be specific, the first optical adjustment layer 4 has refractive index nC of, for example, less than 1.60, preferably 1.55 or less, more preferably 1.53 or less, and for example, 1.20 or more, preferably 1.30 or more.

Meanwhile, when the first optical adjustment layer 4 has refractive index nC, ratio (nC/nA), and/or difference (nA-nC) of more than the above-described lower limit, reduction in optical characteristics of the transparent conductive film 1 (to be specific, suppression of pattern visibility) can be suppressed.

The first optical adjustment layer 4 has a thickness TC of 10 nm or more and 35 nm or less. The thickness TB of the first optical adjustment layer 4 is measured, for example, by observation of cross sections with a transmission electron microscope (TEM).

Meanwhile, when the first optical adjustment layer 4 has thickness TC of less than 10 nm, excellent transparency cannot be ensured in the transparent conductive film 1. Meanwhile, when the thickness TC of the first optical adjustment layer 4 is more than 35 nm, wiring pattern visibility in the transparent conductive layer 6 cannot be suppressed.

The first optical adjustment layer 4 has thickness TC of preferably 15 nm or more.

Furthermore, the ratio (TC/TB) of the thickness TC of the first optical adjustment layer 4 relative to the thickness TB of the second optical adjustment layer 3 is, for example, 0.020 or more, preferably 0.050 or more, more preferably 0.100 or more, even more preferably 0.120 or more, and for example, 0.500 or less, preferably 0.200 or less, more preferably 0.250 or less, even more preferably 0.150 or less.

When the thickness TC and/or ratio (TC/TB) of the first optical adjustment layer 4 is the above-described lower limit or more, excellent transparency is ensured. Meanwhile, when the thickness TC of the first optical adjustment layer 4 is the above-described upper limit or less, wiring pattern visibility in the transparent conductive layer 6 can be suppressed.

5. Inorganic Layer

The inorganic layer 5 is an optical adjustment layer (third optical adjustment layer) that adjusts optical properties of the transparent conductive film 1 along with the above-described second optical adjustment layer 3 and the first optical adjustment layer 4 so as to suppress wiring pattern visibility in the transparent conductive layer 6.

The inorganic layer 5 has a film form (including sheet form), and for example, is disposed on the entire upper face of the first optical adjustment layer 4 so as to be in contact with the upper face of the first optical adjustment layer 4.

The inorganic layer 5 is prepared from an inorganic substance having predetermined optical properties.

Examples of the inorganic substance include oxide and fluoride.

Examples of the oxide include silicon oxide (to be specific, silicon dioxide ($SiO_2$), silicon monoxide (SiO)) and aluminum oxide ($Al_2O_3$).

Examples of the fluoride include alkali metal fluorides such as sodium fluoride (NaF), sodium hexafluoroaluminate ($Na_3AlF_6$), lithium fluoride (LiF), and magnesium fluoride ($MgF_2$); alkaline earth metal fluorides such as calcium fluoride ($CaF_2$) and barium fluoride ($BaF_2$); and rare-earth element fluorides such as lanthanum fluoride ($LaF_3$) and cerium fluoride (CeF).

The inorganic substance can be used singly, or can be used in combination of two or more.

For the inorganic substance, in view of ensuring a desired refractive index nD (described later), preferably, oxide is used, more preferably, silicon dioxide ($SiO_2$: refractive index 1.47) is used.

The inorganic layer 5 has refractive index nD lower than or the same as the absolute value ABV ($=|nC \times 1.13|$) that is produced by multiplying the refractive index nC of the first optical adjustment layer 4 by 1.13. The refractive index nD of the inorganic layer 5 is measured, for example, by Abbe refractometer.

Meanwhile, when the refractive index nD of the inorganic layer 5 has a refractive index nD higher than the above-described absolute value ABV, wiring pattern visibility in the transparent conductive layer 6 cannot be suppressed.

Preferably, the inorganic layer 5 has a refractive index nD that is lower than or the same as the value ($=nC \times 1.13$) obtained by multiplying the refractive index nC of the first optical adjustment layer 4 by 1.13. By setting the refractive index nD of the inorganic layer 5 within the above-described range, reflection between the first optical adjustment layer 4 and the inorganic layer 5 can be suppressed, and as a result, suppression of wiring pattern visibility can be improved.

To be specific, the inorganic layer 5 has refractive index nD of, for example, 1.30 or more, preferably 1.40 or more, and for example, 2.00 or less, preferably 1.90 or less, more preferably 1.80 or less, even more preferably 1.72 or less, particularly preferably 1.60 or less, most preferably 1.50 or less.

The ratio (nD/nC) of the refractive index nD of the inorganic layer 5 relative to the refractive index nC of the first optical adjustment layer 4 is, for example, 0.800 or more, and for example, 1.500 or less, preferably 1.100 or less.

When the refractive index nD and/or the ratio (nD/nC) of the inorganic layer 5 are the above-described lower limits or more, reduction in optical characteristics can be suppressed. Meanwhile, when the nD and/or the ratio (nD/nC) of the inorganic layer 5 are the above-described upper limits or less, wiring pattern visibility can be suppressed.

The inorganic layer 5 has thickness TD of, for example, 20 nm or less, preferably 15 nm or less, more preferably 13 nm or less, even more preferably 10 nm or less, and for example, 1.0 nm or more, preferably 1.5 nm or more. The thickness TD of the inorganic layer 5 is measured, for example, by observation of cross sections with a transmission electron microscope (TEM).

The ratio (TD/TC) of the thickness TD of the inorganic layer 5 relative to the thickness TC of the first optical adjustment layer 4 is, for example, more than 0.050, preferably 0.060 or more, more preferably 0.070 or more, and for example, 0.500 or less, preferably 0.450 or less, more preferably 0.350 or less, even more preferably 0.120 or less, particularly preferably 0.100 or less.

When the above-described thickness TD and/or ratio (TD/TC) of the inorganic layer 5 are the above-described upper limits or less, the transparent conductive film 1 has excellent transparency, and the total thickness of the inorganic layer 5 and the transparent conductive layer 6 can be made thin, increase in the stress on the transparent conductive layer 6 can be suppressed, and damages on the transparent conductive layer 6 can be suppressed. Meanwhile, when the above-described thickness TD and/or ratio (TD/TC) of the inorganic layer 5 are the above-described lower limits or more, wiring pattern visibility can be suppressed, and generation of gas from the second optical adjustment layer 3 and the first optical adjustment layer 4 can be suppressed, and damages on the transparent conductive layer 6 can be suppressed.

6. Transparent Conductive Layer

The transparent conductive layer 6 is, as shown in FIG. 2, a conductive layer which is formed into a wiring pattern in a later step for forming a pattern portion 7.

As shown in FIG. 1, the transparent conductive layer 6 is the uppermost layer in the transparent conductive film 1, and has a film form (including sheet form).

Examples of the material forming the transparent conductive layer 6 include metal oxide containing metal of at least one selected from the group consisting of In, Sn, Zn, Ga, Sb, Ti, Si, Zr, Mg, Al, Au, Ag, Cu, Pd, and W. The metal oxide can further be doped, as necessary, with metal atoms shown in the above-described group.

For the material, preferably, indium tin composite oxide (ITO) and antimony tin composite oxide (ATO) are used, more preferably, ITO is used.

The material can be any of crystalline and amorphous, and can be a mixture of crystalline and amorphous. The material is preferably crystalline.

The transparent conductive layer 6 has refractive index nE of, for example, 1.70 or more, preferably 1.80 or more, and for example, 2.10 or less, preferably 2.00 or less. The refractive index nE of the transparent conductive layer 6 is measured, for example, by Abbe refractometer.

The transparent conductive layer 6 has thickness TE of, for example, 15 nm or more, preferably 20 nm or more, more preferably 25 nm or more, and for example, 50 nm or less, preferably 35 nm or less.

The thickness TE of the transparent conductive layer 6 is calculated by measuring X-ray reflectivity with a powder X-ray diffraction device, and this is specifically described later in Examples.

The ratio (TE/TD) of the thickness TE of the transparent conductive layer 6 relative to the thickness TD of the inorganic layer 5 is, for example, 5 or more, preferably 8 or more, and for example, 20 or less, preferably 15 or less.

When the thickness TE and/or the ratio (TE/TD) of the transparent conductive layer 6 are the above-described lower limits or more, a suitable transparent conductive layer 6 for use for a touch panel with a low resistance can be produced. Meanwhile, when the thickness TE and/or the ratio (TE/TD) of the transparent conductive layer 6 are the above-described upper limit or less, the stress on the transparent conductive layer 6 can be suppressed, and risk of generation of damages on the transparent conductive layer 6 such as cracks can be suppressed.

7. Production Method of Transparent Conductive Film

Next, a method of producing a transparent conductive film 1 is described.

To produce a transparent conductive film 1, for example, a second optical adjustment layer 3, a first optical adjustment layer 4, an inorganic layer 5, and a transparent conductive layer 6 are disposed (laminated) on the transparent substrate 2 in the above-described order.

In this method, as shown in FIG. 1, first, a transparent substrate 2 is prepared.

Then, the second optical composition is disposed on the upper face of the transparent substrate 2, by, for example, wet method.

To be specific, first, a diluted solution, which is a solution of the second optical composition diluted with a solvent, is prepared, and then the diluted solution is applied on the upper face of the second optical adjustment layer 3 and the diluted solution is dried.

Examples of the solvent include organic solvent and water-based solvent (to be specific, water), preferably, organic solvent. Examples of the organic solvent include alcohol compounds such as methanol, ethanol, and isopropyl alcohol; ketone compounds such as acetone, methyl ethyl ketone, and methylisobutylketone (MIBK); ester compounds such as ethyl acetate and butyl acetate; and aromatic compounds such as toluene and xylene. Preferably, ketone compounds are used. The solvent can be used singly or can be used in combination of two or more.

The second optical composition is diluted with a solvent so that the diluted solution has a solid content concentration of, for example, 0.5 mass % or more and 5.0 mass % or less.

Examples of the application method include fountain coating, die coating, spin coating, spray coating, gravure coating, roll coating, and bar coating.

The drying temperature is, for example, 60° C. or more, preferably 80° C. or more, and for example, 250° C. or less, preferably 200° C. or less.

The drying time is, for example, 1.0 minute or more, preferably 2.0 minutes or more, and for example, 1.0 hour or less, preferably 0.5 hours or less.

The above-described application and drying form a film of the second optical composition on the upper face of the transparent substrate 2.

Thereafter, when the second optical composition contains the active energy ray curable resin, an active energy ray is applied to cure the active energy ray curable resin after drying the diluted solution.

In this manner, the second optical adjustment layer 3 is formed on the entire upper face of the transparent substrate 2.

Then, the first optical composition is disposed on the upper face of the second optical adjustment layer 3 by, for example, wet processing.

To be specific, first, a diluted solution, which is a solution of the first optical composition diluted with a solvent, and then the diluted solution is applied on the upper face of the transparent substrate 2 and the diluted solution is dried.

Examples of the solid content concentration and solvent for the diluted solution, its application and drying method include those shown as examples for the diluted solution of the second optical composition.

When the first optical composition contains thermosetting resin, the above-described drying allows for drying of the solvent and curing of the thermosetting resin by heat.

The first optical adjustment layer 4 is formed on the upper face of the second optical adjustment layer 3 in this manner.

Thereafter, as necessary, the transparent substrate, the second optical adjustment layer, and the first optical adjustment layer are allowed to stand under a reduced pressure atmosphere of, for example, $1 \times 10^{-1}$ Pa or less, preferably $1 \times 10^{-3}$ Pa or less, thereby performing degassing. The degassing can be performed, using a vacuum pump (to be specific, including turbo molecule pump) included in a drying process device to be described later.

Then, the inorganic layer 5 is disposed on the upper face of the first optical adjustment layer 4 by, for example, drying process.

Examples of the dry processing include vacuum deposition, sputtering, and ion plating. Preferably, sputtering is used. To be specific, magnetron sputtering is used.

When using sputtering, examples of the target material include the aforementioned inorganic substances.

Examples of the gas used in sputtering include inert gas such as Ar.

When the inorganic layer 5 is prepared from oxide, reactive sputtering is used. In reactive sputtering, elements containing oxide are used as the target material, and during reactive sputtering, reactive gas such as oxygen is introduced as gas, and elements are allowed to react (to be specific, oxidized) during transition of reactive sputtering. In such a case, percentage of the reactive gas flow rate relative to the total flow rate of the inert gas and reactive gas is, for example, 0.1% or more and 60% or less.

When the inorganic layer 5 is formed (or film is formed) on the upper face of the first optical adjustment layer 4 by reactive sputtering, by monitoring plasma emission intensity and discharge voltage at the time of reactive sputtering to control the transition region, film-forming rate can be improved. In addition, by controlling, for example, emission intensity of plasma, the oxidation number of the inorganic layer 5 (and also refractive index nD of the inorganic layer 5) can be controlled as well.

The power source used for sputtering can be, for example, any of a DC power source, MF power source, and a RF power source, and can be a combination of these.

In this manner, the inorganic layer 5 is formed on the entire upper face of the first optical adjustment layer 4.

Then, the transparent conductive layer 6 is disposed on the entire upper face of the inorganic layer 5 by, for example, drying process.

Examples of the drying process include the method given as examples above, and preferably, sputtering, more preferably, magnetron sputtering is used.

When sputtering is used, for the target material, the above-described metal oxide is used.

The gas and the flow rate used in sputtering are the same as described above.

In this manner, the transparent conductive layer 6 is disposed on the upper face of the inorganic layer 5.

Thereafter, as necessary, the transparent conductive layer 6 is crystallized. To crystallize the transparent conductive layer 6, for example, the transparent conductive layer 6 is heated.

In the transparent conductive film 1, the transparent conductive layer 6 has a specific resistance of, for example, $3.0 \times 10^{-4}$ $\Omega \cdot cm$ or less, and for example, $1.1 \times 10^{-4}$ $\Omega \cdot cm$ or more.

In this manner, as shown in FIG. 1, the transparent conductive film 1 including the transparent substrate 2, the second optical adjustment layer 3, the first optical adjustment layer 4, the inorganic layer 5, and the transparent conductive layer 6 is produced.

The transparent conductive film 1 has a total thickness of, for example, 2 μm or more, preferably 20 μm or more, and for example, 200 μm or less, preferably 150 μm or less.

In the above-described production method, the second optical adjustment layer 3, the first optical adjustment layer 4, the inorganic layer 5, and the transparent conductive layer 6 can be sequentially formed on the upper face of the transparent substrate 2 by roll-to-roll method while transporting the transparent substrate 2, or a part of the layers or the whole layers can be formed by batch processing.

In the transparent conductive film 1, thereafter, as shown in FIG. 2, the transparent conductive layer 6 is formed into a wiring pattern by etching, and a pattern portion 7 and a non-pattern portion 8 are formed on the inorganic layer 5. In the non-pattern portion 8, the upper face of the inorganic layer 5 is exposed from the pattern portion 7. The width L of the pattern portions 7 is, for example, 10 μm or more and 500 μm or less, and space S (that is, width S of non-pattern portion 8) between adjacent pattern portions 7 is, for example, 10 μm or more and 500 μm or less.

Thereafter, the transparent conductive film 1 is included, for example, in an image display device.

In particular, the transparent conductive film 1 is used, for example, for a substrate for a touch panel. The touch panel can be a touch panel of various forms including optical type, ultrasonic wave type, capacitive type, and resistive film type, and especially used suitably for capacitive type touch panel.

8. Operations and Effects

The transparent conductive film 1 includes the first optical adjustment layer 4 having predetermined refractive index nC and thickness TC, and the inorganic layer 5 having a predetermined refractive index nD, and therefore damages on the transparent conductive layer 6 can be suppressed, visibility of the wiring pattern (pattern portion 7, ref: FIG. 2) in the transparent conductive layer 6 can be suppressed, and excellent abrasion resistance and excellent transparency can be achieved.

The transparent conductive film 1 further includes a second optical adjustment layer 3 disposed between the transparent substrate 2 and the first optical adjustment layer 4, and the second optical adjustment layer 3 had refractive index nB higher than the refractive index nA of the transparent substrate 2, and therefore wiring pattern visibility can be further suppressed, and more excellent abrasion resistance can be achieved.

In the transparent conductive film 1, the thickness TB of the second optical adjustment layer 3 is within the predetermined range as described above, and therefore wiring pattern visibility can further be suppressed, and more excellent abrasion resistance can be achieved.

In the transparent conductive film 1, the inorganic layer 5 has thickness TD within predetermined range, and therefore damages on the transparent conductive layer 6 can be suppressed even more.

In the transparent conductive film 1, thickness TD of the inorganic layer 5 is within a predetermined range, and therefore damages to the transparent conductive layer 6 can be suppressed even more.

When the thickness nE of the transparent conductive layer 6 is the above-described 25 nm or more, transparent conductive layer 6 is easily damaged. This is considered to be more significant when the lower layer of the transparent conductive layer 6 contains a large amount of impurity gas, and when coefficient of linear expansion by heat is high. However, because the transparent conductive film 1 includes the above-described predetermined first optical adjustment layer 4 and inorganic layer 5, impurity gas does not easily generate at the lower layer of the transparent conductive layer 6, and the expansion rate of the inorganic layer 5 is low, and therefore the above-described damages on the transparent conductive layer 6 can be effectively suppressed.

When the first optical adjustment layer 4 contains particles, the bumpiness of the particles cause partial increase in stress in the inorganic layer 5 and the transparent conductive layer 6, and therefore damages on the transparent conductive layer 6 may not be suppressed effectively. However, in the transparent conductive film 1, when the first optical adjustment layer 4 is composed only of resin, the above-described increase in stress can be suppressed, and therefore damages on the transparent conductive layer 6 can be effectively suppressed.

<Modification>

In the first embodiment, the second optical adjustment layer 3 is brought into contact with the upper face of the transparent substrate 2, but it is not limited thereto. For example, although not shown, other layer can be interposed between the second optical adjustment layer 3 and the transparent substrate 2 without allowing the second optical adjustment layer 3 to be brought into contact with the upper face of the second optical adjustment layer 3.

In the first embodiment, the first optical adjustment layer 4 is brought into contact with the upper face of the second optical adjustment layer 3, but it is not limited thereto. For example, other layer can be interposed between the first optical adjustment layer 4 and the second optical adjustment layer 3 without allowing the first optical adjustment layer 4 to be in contact with the upper face of the first optical adjustment layer 4.

In the first embodiment, the inorganic layer 5 is brought into contact with the upper face of the first optical adjustment layer 4, but it is not limited thereto. For example, other layer can be interposed between the inorganic layer 5 and the first optical adjustment layer 4, without allowing the inorganic layer 5 to be brought into contact with the upper face of the first optical adjustment layer 4.

Second Embodiment

In the second embodiment, those members and steps that are the same as those in the first embodiment are designated with the same reference numerals, and detailed descriptions thereof are omitted.

Figure 3:
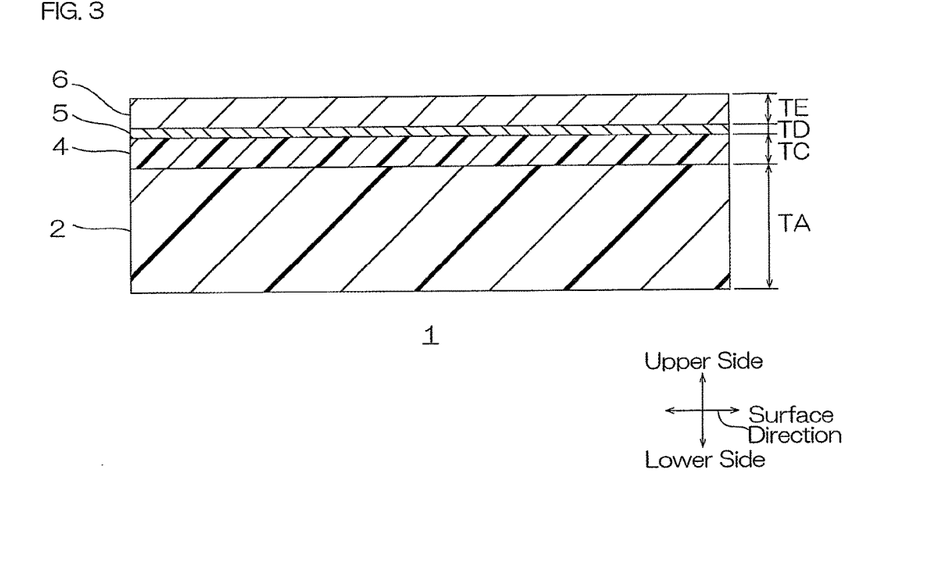
FIG. 3 shows a cross-sectional view of the transparent conductive film of the present invention in the second embodiment (embodiment in which a second optical adjustment layer is not included).

As shown in FIG. 3, the transparent conductive film 1 includes a transparent substrate 2, a first optical adjustment layer 4, an inorganic layer 5, and a transparent conductive layer 6 in this order. That is, the transparent conductive film 1 includes the transparent substrate 2, the first optical adjustment layer 4 disposed on the transparent substrate 2, the inorganic layer 5 disposed on the first optical adjustment layer 4, and the transparent conductive layer 6 disposed on the inorganic layer 5. That is, the transparent conductive film 1 in the second embodiment does not include the second optical adjustment layer 3 disposed between the transparent substrate 2 and the first optical adjustment layer 4 in the transparent conductive film 1 in the first embodiment. Preferably, the transparent conductive film 1 is composed only of the transparent substrate 2, the first optical adjustment layer 4, the inorganic layer 5, and the transparent conductive layer 6.

The first optical adjustment layer 4 is disposed, for example, on the entire upper face of the transparent substrate 2 so as to be in contact with the upper face of the transparent substrate 2.

To produce the transparent conductive film 1 in the second embodiment, for example, the first optical adjustment layer 4, the inorganic layer 5, and the transparent conductive layer 6 are disposed (laminated) on the transparent substrate 2 in the above-described order.

The transparent conductive film 1 in the second embodiment achieves the same operations and effects as that of the transparent conductive film 1 in the first embodiment.

In particular, unlike the transparent conductive film 1 in the first embodiment in FIG. 1, the transparent conductive film 1 in the second embodiment as shown in FIG. 3 does not include the second optical adjustment layer 3, and therefore production costs can be decreased, and the transparent conductive film 1 can be produced easily. Furthermore, the transparent conductive film 1 can be made thin.

Meanwhile, unlike the transparent conductive film 1 in the second embodiment shown in FIG. 1, the transparent conductive film 1 in the first embodiment shown in FIG. 1 includes the second optical adjustment layer 3, and therefore excellent abrasion resistance can be produced.

<Modification>

In the second embodiment, the first optical adjustment layer 4 is in contact with the upper face of the transparent substrate 2, but it is not limited thereto. For example, although not shown, the other layer can be interposed between the first optical adjustment layer 4 and the transparent substrate 2 instead of allowing the first optical adjustment layer 4 to be in contact with the upper face of the transparent substrate 2.

EXAMPLES

The present invention will be described hereinafter in further detail with reference to Examples and Comparative Examples. However, the present invention is not limited to these Examples and Comparative Examples. The specific values such as mixing ratios (content), physical properties, and parameters used in the description below can be replaced with the corresponding upper limit value (values defined as "or less" and "less than") or lower limit value (values defined as "or more" and "more than") of the mixing ratios (content), physical properties, and parameters described in the above-described DESCRIPTION OF EMBODIMENTS.

Example 1

(Preparation of Transparent Substrate)

A polyethylene terephthalate (PET) film (manufactured by Mitsubishi Plastics, Inc., product name "DIAFOIL") having a thickness of 50 μm was prepared as the transparent substrate.

(Formation of Second Optical Adjustment Layer)

An ultraviolet curable resin composition (second optical composition) composed of an ultraviolet curable acrylic resin and zirconium oxide ($ZnO_2$) particles (average particle size 20 nm) was diluted with MIBK to give a solid content concentration of 5 mass %, thereby preparing a diluted solution of the ultraviolet curable resin composition. Then, the diluted solution was applied on the upper face of the transparent substrate, and dried, thereby forming the ultraviolet curable resin composition into a film form. Then, ultraviolet ray was applied on the ultraviolet curable resin composition to be cured.

In this manner, a second optical adjustment layer having a thickness of 200 nm was formed on the entire upper face of the transparent substrate.

(Formation of First Optical Adjustment Layer)

A thermosetting resin composition (first optical composition) composed of 100 parts by mass of a thermosetting epoxy resin and 1 part by mass of a curing agent for epoxy resin was diluted with MIBK to give a solid content concentration of 0.8 mass %, thereby preparing a diluted solution of the thermosetting resin composition. Then, the diluted solution was applied on the upper face of the second optical adjustment layer, and heated at 195° C. for 1 minute to dry the diluted solution, thereby curing the thermosetting resin composition.

In this manner, the first optical adjustment layer having a thickness of 25 nm was formed on the entire upper face of the second optical adjustment layer.

(Degassing Process)

A laminate film composed of the transparent substrate, the second optical adjustment layer, and the first optical adjustment layer was attached to a DC magnetron sputtering device, and was rolled in while being brought into contact with a heated film-forming roll and being transported. While transporting the laminate film, the degree of vacuum in the atmosphere was set to $1 \times 10^{-4}$ Pa with a vacuum pump (for example, turbo molecular pump) included in the DC magnetron sputtering device.

(Formation of Inorganic Layer)

With the DC magnetron sputtering, an inorganic layer composed of $SiO_2$ (silicon dioxide) and having a thickness of 2 nm was formed on the upper face of the first optical adjustment layer.

The conditions for sputtering are as follows.
Target material: Si
Gas: Ar and $O_2$: ($O_2$ flow rate 30%(/total flow amount of Ar and $O_2$))
Pressure: 0.2 Pa (Formation of Transparent Conductive Layer)

A transparent conductive layer composed of ITO and having a thickness of 26 nm was formed on the upper face of the inorganic layer by DC magnetron sputtering while keeping the degree of vacuum of the vacuum sputtering device. The inorganic layer was amorphous.

The sputtering conditions are as follows.
Target material: ITO with tin oxide concentration of 10 mass %
Gas: Ar and $O_2$ ($O_2$ flow rate: 0.1%(/total flow amount of Ar and $O_2$))
Pressure: 0.4 Pa (Crystallization)

Then, the laminate film in which the second optical adjustment layer, the first optical adjustment layer, the inorganic layer, and the amorphous transparent conductive layer were formed in order on the transparent substrate was taken out from the DC magnetron sputtering device, and heated in an oven of 150° C. for 120 minutes. In this manner, the transparent conductive layer was crystallized. In this manner, the transparent conductive film in which the second optical adjustment layer, the first optical adjustment layer, the inorganic layer, and the amorphous transparent conductive layer were formed in order on the transparent substrate was produced (ref: FIG. 1).

Example 2

A transparent conductive film was produced in the same manner as in Example 1, except that the thickness of the second optical adjustment layer was changed to 100 nm (ref: FIG. 1).

Example 3

A transparent conductive film was produced in the same manner as in Example 1, except that the thickness of the second optical adjustment layer was changed to 300 nm (ref: FIG. 1).

Example 4

A transparent conductive film was produced in the same manner as in Example 1, except that the thickness of the first optical adjustment layer was changed to 5 nm (ref: FIG. 1).

Example 5

A transparent conductive film was produced in the same manner as in Example 1, except that the thickness of the first optical adjustment layer was changed to 35 nm (ref: FIG. 1).

Example 6

A transparent conductive film was produced in the same manner as in Example 1, except that an inorganic layer composed of SiO (silicon monoxide) was formed (ref: FIG. 1).

That is, sputtering conditions were changed as follows.
Target material: Si
Gas: Ar and $O_2$: ($O_2$ flow rate 15%(/total flow amount of Ar and $O_2$))
Pressure: 0.2 Pa Example 7

A transparent conductive film was produced in the same manner as in Example 1, except that the first optical adjustment layer contained hollow nanosilica particles (average particle size 45 nm) (ref: FIG. 1).

That is, the first optical adjustment layer was formed in the following manner.

That is, hollow nanosilica particle-containing acrylate resin (silica particles average particle size 45 nm, silica nanoparticle content 80 mass %) was mixed with MIBK, thereby preparing a particle-containing resin mixture liquid having a solid content concentration of 1.5 mass %. Ultrasonic dispersion was conducted for the particle-containing resin mixture liquid for 5 minutes, and the components were dispersed homogeneously. Then, the particle-containing resin mixture liquid was applied on the upper face of the second optical adjustment layer using a bar coater, and dried in an oven of 80° C. for 1 minute, and thereafter irradiated with UV (accumulated light amount 300 mJ), thereby forming the first optical adjustment layer (thickness 25 nm, particle-containing optical adjustment layer).

Example 8

A transparent conductive film was produced in the same manner as in Example 1, except that the thickness of the inorganic layer was changed to 10 nm (ref: FIG. 1).

Example 9

A transparent conductive film was produced in the same manner as in Example 1, except that the thickness of the inorganic layer was changed to 12 nm (ref: FIG. 1).

Example 10

A transparent conductive film was produced in the same manner as in Example 1, except that the second optical adjustment layer was not formed (ref: FIG. 3).

Example 11

A transparent conductive film was produced in the same manner as in Example 1, except that the thickness of the second optical adjustment layer was changed to 90 nm (ref: FIG. 1).

Example 12

A transparent conductive film was produced in the same manner as in Example 1, except that the thickness of the second optical adjustment layer was changed to 350 nm (ref: FIG. 1).

Comparative Example 1

A transparent conductive film was produced in the same manner as in Example 1, except that the inorganic layer was not formed.

That is, the transparent conductive film is composed only of the transparent substrate, the second optical adjustment layer, the first optical adjustment layer, and the transparent conductive layer. The transparent conductive layer was in contact with the upper face of the first optical adjustment layer.

Comparative Example 2

A transparent conductive film was produced in the same manner as in Example 1, except that the second optical adjustment layer was not formed, and the thickness of the first optical adjustment layer was changed to 3 nm (ref: FIG. 3).

Comparative Example 3

A transparent conductive film was produced in the same manner as in Example 1, except that the second optical adjustment layer was not formed, and the thickness of the first optical adjustment layer was changed to 40 nm (ref: FIG. 3).

Comparative Example 4

A transparent conductive film was produced in the same manner as in Example 1, except that the thickness of the first optical adjustment layer was changed to 3 nm (ref: FIG. 1).

Comparative Example 5

A transparent conductive film was produced in the same manner as in Example 1, except that the thickness of the first optical adjustment layer was changed to 40 nm (ref: FIG. 1).

Comparative Example 6

A transparent conductive film was produced in the same manner as in Example 1, except that first, a second optical adjustment layer was made in the same manner as the first optical adjustment layer of Example 1, and thereafter, a first optical adjustment layer was made in the same manner as the second optical adjustment layer of Example 1.

Comparative Example 7

A transparent conductive film was produced in the same manner as in Example 1, except that a $Nb_2O_5$ layer was formed as the inorganic layer (ref: FIG. 1).

That is, sputtering conditions were changed as follows.
Target material: Nb
Gas: Ar and $O_2$: ($O_2$ flow rate 30%(/total flow amount of Ar and $O_2$))
Pressure: 0.2 Pa (Measurement of Thickness)

A. Second Optical Adjustment Layer Thickness (TB), First Optical Adjustment Layer Thickness (TC), and Inorganic Layer Thickness (TD)

The second optical adjustment layer thickness (TB), first optical adjustment layer thickness (TC), and inorganic layer thickness (TD) of the transparent conductive film of Examples and Comparative Examples were measured by observation of cross sections with a transmission electron microscope (TEM). The results are shown in Tables 1 and 2.

B. Transparent Conductive Layer Thickness (TE)

The thickness of transparent conductive layer (TE) in the transparent conductive film of Examples and Comparative Examples was calculated in the following manner by measuring X-ray reflectivity.

That is, using X-ray reflectivity as measurement principle, X-ray reflectivity was calculated by measurement with a powder X-ray diffraction device (manufactured by Rigaku Corporation, RINT-2000) with the following measurement conditions, and analysis on the obtained measurement data with an analysis software (manufactured by Rigaku Corporation, GXRR 3). Analysis conditions are set as follows, and the thickness of the transparent conductive layer was calculated using a two-layer model of the transparent substrate and the transparent conductive layer having a density of 7.1 $g/cm^3$, using the transparent conductive layer thickness (TE) and surface roughness as variants, and performing least squares fitting. The results are shown in Tables 1 and 2.

[Measurement Conditions]
Light source: Cu-Kα ray (wavelength: 1,5418 Å), 40 kV, 40 mA
Optical system: parallel beam optical system
Divergent slit: 0.05 mm
Acceptance slit: 0.05 mm
Monochromatization and parallelization: used multilayer Göbel Mirror
Measurement mode: θ/2θ scan mode
Measurement range (2θ): 0.3 to 2.0°
[Analysis Conditions]
Analysis method: least squares fitting
Analysis range (2θ): 2θ=0.3 to 2.0°

C. Transparent Substrate Thickness TA

For the transparent substrate thickness TA, the values described in the catalog of the transparent substrate prepared were used.

D. Thickness Ratio

The thickness ratios, that is, TB/TA, TC/TB, TD/TC, and TE/TD were calculated. The results are shown in Tables 1 and 2.

(Measurement of Refractive Index)

The second optical adjustment layer refractive index (nB), the first optical adjustment layer refractive index (nC), the inorganic layer refractive index (nD), the transparent conductive layer refractive index (nE) of the transparent conductive film of Examples and Comparative Examples were measured with Abbe refractometer.

For the transparent substrate refractive index (nA), the values described in the catalog of the transparent substrate were used. The results are shown in Tables 1 and 2.

The refractive index ratios, that is, nB/nA, nC/nA, and nD/nC were calculated. The nC×1.13 value was calculated. The results are shown in Tables 1 and 2.

(Crack Resistance (Damage Suppression))

Crack resistance (damage suppression) of the transparent conductive film of Examples and Comparative Examples was evaluated based on the following criteria and operation.

Figure 4:
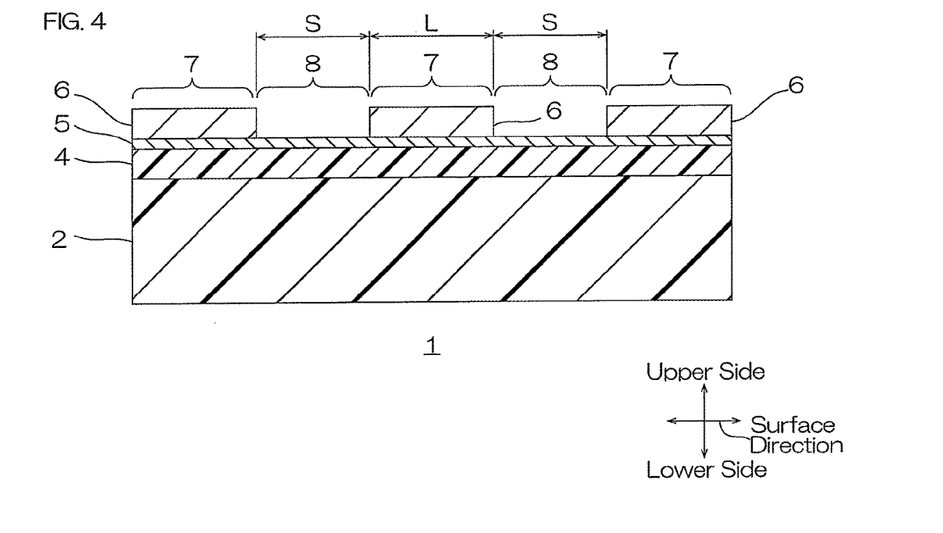
FIG. 4 shows a cross-sectional view of the transparent conductive film in the second embodiment, in which the transparent conductive layer is formed into a wiring pattern.

That is, the produced transparent conductive film was cut out into a size of 6 cm×6 cm, and three polyimide tapes having a width of 1 mm were attached to the surface of the transparent conductive layer of the transparent conductive film that was cut with a 10 mm space therebetween in stripes within the surface. Then, the transparent conductive film in this state was immersed in 10 mass % hydrochloric acid (HCl) of 50° C., and the transparent conductive layer was etched (ref: FIG. 2 and FIG. 4). Thereafter, the polyimide tape was removed from the transparent conductive film, dried at 150° C. for 30 minutes, and thereafter, attached to a glass plate having a thickness of 700 μm using a transparent glue. To be specific, the transparent conductive layer was attached to the glass plate using the glue. With this state, the transparent conductive layer was allowed to stand under an environment of 85° C. 85% RH for a predetermined time, and thereafter, generation of cracks (damages) on the transparent conductive layer were observed with a laser microscope with a magnitude of 20.

Criteria

Excellent ○: No crack generation under environment of 85° C. 85% RH after passing 120 hours and after 240 hours.
Good Δ: No generation of cracks under an environment of 85° C. and 85% RH after passing 120 hours but cracks generated after passing 240 hours.
Bad x: Generation of cracks under an environment of 85° C. and 85% RH both after passing 120 hours and 240 hours.

(Abrasion Resistance)

The abrasion resistance of the transparent conductive film of Examples and Comparative Examples was evaluated based on the following criteria with the following operation.

The transparent conductive film heated at 140° C. for 90 minutes was cut into a rectangle of 5 cm×11 cm, and a silver paste was applied on both end portions of 5 mm at long sides, and subjected to natural drying for 48 hours. Next, the lower face of the transparent substrate of the transparent conductive film was attached to a glass plate with an adhesive, thereby producing a sample for abrasion characteristics evaluation. Then, using a 10 barrel pen tester (manufactured by M.T.M), the transparent conductive layer surface of the sample for abrasion characteristics evaluation was scratched in the long side direction for a length of 10 cm at a center portion (2.5 cm position) of the short side of the sample for abrasion evaluation with the following conditions. The resistance value (R0) of the sample for abrasion characteristics evaluation before scratching and the resistance value (R 20) of the sample for abrasion characteristics evaluation after scratching were measured by applying a tester at the silver paste portion of the both end portion at a center portion (5.5 cm position) of the long side of the sample for abrasion characteristics evaluation, and a resistance change rate (R20/R0) was obtained, thereby evaluating the abrasion resistance.

For abrasion: Anticon® Gold (manufactured by CONTEC Inc.)
Load: 127 g/cm$^2$
Abrasion speed: 13 cm/sec (7.8 m/min)
Abrasion times: 20 times (10 times reciprocating)
Excellent ○: resistance change rate of 1.5 or less
Good Δ: resistance change rate of more than 1.5 and 2.5 or less
Bad x: resistance change rate of more than 2.5

(Transparency)

The transparency of the transparent conductive film of Examples and Comparative Examples was evaluated based on the following criteria by measuring transmission Y at transmission XYZ coordinates of the transparent conductive film.

To be specific, for the measurement device, DOT-3C (fast spectrophotometric transmittance meter, manufactured by Murakami Color Research Laboratory) or an equivalent device thereof. Light was applied from the transparent conductive layer side of the transparent conductive film, and transmission spectrum was obtained from the transparent substrate side. Then, transmission value Y was calculated from the spectrum. At that time, the illuminant used was the illuminant D65 specified in JIS Z 8716, and the angle of view was 2 degrees.

Criteria

Good ○: transmission Y of 88 or more.
Bad x: transmission Y of less than 88.

(Suppression of Wiring Pattern Visibility (Appearance))

Wiring pattern visibility was evaluated as follows.

A polyimide tape having a width of 1 mm was attached in stripes along the short side directions of the transparent conductive film on the surface of the transparent conductive layer of the transparent conductive film of 5 cm×10 cm with a space of 2 mm therebetween, and then immersed in 10 mass % hydrochloric acid at 50° C. for 5 minutes. In this manner, as shown in FIG. 2, the transparent conductive layer was formed into a wiring pattern having a striped pattern portion.

Thereafter, the polyimide tape was removed, and the transparent conductive layer was attached to a black board, thereby producing a sample for wiring pattern visibility evaluation.

Thereafter, the wiring pattern was observed, and the visibility suppression (appearance) was evaluated based on the following criteria.

Criteria

Excellent ○: the conductive layer pattern is almost invisible.
Good Δ: the conductive layer pattern is almost invisible but visible depending on the angles.
Bad x: the conductive layer pattern is obviously visible.

TABLE 1

| Examples•Comparative Examples | Transparent substrate | | Second optical adjustment layer | | | | | First optical adjustment layer | | | | | |
|---|---|---|---|---|---|---|---|---|---|---|---|---|---|
| | Thickness TA (μm) | Refraction nA | Thickness TB (nn) | Thickness ratio TB/TA | Refraction nB | Refraction ratio nB/nA | Refraction difference nB − nA | Thickness TC (nm) | Thickness ratio TC/TB | Refraction nC | Refraction ratio nC/nA | nC × 1.13 | Refraction ratio nA − nC |
| Example 1 | 50 | 1.65 | 200 | 0.0040 | 1.75 | 0.00 | 0.10 | 25 | 0.125 | 1.52 | 0.921 | 1.72 | 0.13 |
| Example 2 | 50 | 1.65 | 100 | 0.0020 | 1.75 | 0.00 | 0.10 | 25 | 0.250 | 1.52 | 0.921 | 1.72 | 0.13 |
| Example 3 | 50 | 1.65 | 300 | 0.0060 | 1.75 | 0.00 | 0.10 | 25 | 0.083 | 1.52 | 0.921 | 1.72 | 0.13 |
| Example 4 | 50 | 1.65 | 200 | 0.0040 | 1.75 | 0.00 | 0.10 | 5 | 0.025 | 1.52 | 0.921 | 1.72 | 0.13 |
| Example 5 | 50 | 1.65 | 200 | 0.0040 | 1.75 | 0.00 | 0.10 | 35 | 0.175 | 1.52 | 0.921 | 1.72 | 0.13 |
| Example 6 | 50 | 1.65 | 200 | 0.0040 | 1.75 | 0.00 | 0.10 | 25 | 0.125 | 1.52 | 0.921 | 1.72 | 0.13 |
| Example 7 | 50 | 1.65 | 200 | 0.0040 | 1.75 | 0.00 | 0.10 | 25*[2] | 0.125 | 1.52 | 0.921 | 1.72 | 0.13 |
| Example 8 | 50 | 1.65 | 200 | 0.0040 | 1.75 | 0.00 | 0.10 | 25 | 0.125 | 1.52 | 0.921 | 1.72 | 0.13 |
| Example 9 | 50 | 1.65 | 200 | 0.0040 | 1.75 | 0.00 | 0.10 | 25 | 0.125 | 1.52 | 0.921 | 1.72 | 0.13 |
| Example 10 | 50 | 1.65 | — | — | — | — | — | 25 | — | 1.52 | 0.921 | 1.72 | 0.13 |
| Example 11 | 50 | 1.65 | 90 | 0.0018 | 1.75 | 0.00 | 0.10 | 25 | 0.278 | 1.52 | 0.921 | 1.72 | 0.13 |
| Example 12 | 50 | 1.65 | 350 | 0.0070 | 1.75 | 0.00 | 0.10 | 25 | 0.071 | 1.52 | 0.921 | 1.72 | 0.13 |

| Examples•Comparative Examples | Inorganic layer | | | | Transparent conductive layer | | | Evaluation | | | |
|---|---|---|---|---|---|---|---|---|---|---|---|
| | Thickness TD (nm) | Thickness ratio TD/TC | Refraction nD | Refraction ratio nD/nC | Thickness TE (nm) | Thickness ratio TE/TD | Refraction nE | Crack suppression | Abrasion resistance | Transparency | Wiring pattern visibility suppression |
| Example 1 | 2 | 0.080 | 1.47 | 0.967 | 26 | 13 | 1.92 | ○ | ○ | ○ | ○ |
| Example 2 | 2 | 0.080 | 1.47 | 0.967 | 26 | 13 | 1.92 | ○ | ○ | ○ | ○ |
| Example 3 | 2 | 0.080 | 1.47 | 0.967 | 26 | 13 | 1.92 | ○ | ○ | ○ | ○ |
| Example 4 | 2 | 0.400 | 1.47 | 0.967 | 26 | 13 | 1.92 | ○ | ○ | ○ | ○ |
| Example 5 | 2 | 0.057 | 1.47 | 0.967 | 26 | 13 | 1.92 | ○ | ○ | ○ | ○ |
| Example 6 | 2 | 0.080 | 1.72*[1] | 1.132 | 26 | 13 | 1.92 | ○ | ○ | ○ | ○ |
| Example 7 | 2 | 0.080 | 1.47 | 0.967 | 26 | 13 | 1.92 | Δ | ○ | ○ | ○ |
| Example 8 | 10 | 0.400 | 1.47 | 0.967 | 26 | 2.6 | 1.92 | ○ | ○ | ○ | ○ |
| Example 9 | 12 | 0.480 | 1.47 | 0.967 | 26 | 2.16667 | 1.92 | Δ | ○ | ○ | ○ |
| Example 10 | 2 | 0.080 | 1.47 | 0.967 | 26 | 13 | 1.92 | ○ | Δ | ○ | Δ |
| Example 11 | 2 | 0.080 | 1.47 | 0.967 | 26 | 13 | 1.92 | ○ | Δ | ○ | ○ |
| Example 12 | 2 | 0.080 | 1.47 | 0.967 | 26 | 13 | 1.92 | ○ | ○ | ○ | Δ |

*[1] SiO
*[2] containing particles composed of hollow nanosilica

TABLE 2

| Examples•Comparative Examples | Transparent substrate | | Second optical adjustment layer | | | | | First optical adjustment layer | | | | | |
|---|---|---|---|---|---|---|---|---|---|---|---|---|---|
| | Thickness TA (μm) | Refraction nA | Thickness TB (nm) | Thickness ratio TB/TA | Refraction nB | Refraction ratio nB/nA | Refraction difference nB − nA | Thickness TC (μm) | Thickness ratio TC/TB | Refraction nC | Refraction ratio nC/nA | nC × 1.13 | Refraction ratio nA − nC |
| Comparative Example 1 | 50 | 1.65 | 200 | 0.0040 | 1.75 | 0.00 | 0.10 | 25 | 0.125 | 1.52 | 0.921 | 1.72 | 0.13 |
| Comparative Example 2 | 50 | 1.65 | — | — | — | — | — | 3 | — | 1.52 | 0.921 | 1.72 | 0.13 |
| Comparative Example 3 | 50 | 1.65 | — | — | — | — | — | 40 | — | 1.52 | 0.921 | 1.72 | 0.13 |
| Comparative Example 4 | 50 | 1.65 | 200 | 0.0040 | 1.75 | 0.00 | 0.10 | 3 | 0.015 | 1.52 | 0.921 | 1.72 | 0.13 |
| Comparative Example 5 | 50 | 1.65 | 200 | 0.0040 | 1.75 | 0.00 | 0.10 | 40 | 0.200 | 1.52 | 0.921 | 1.72 | 0.13 |
| Comparative Example 6 | 50 | 1.65 | 200 | 0.0040 | 1.52 | 0.00 | −0.13 | 25 | 0.125 | 1.75 | 1.061 | 1.98 | −0.10 |
| Comparative Example 7 | 50 | 1.65 | 200 | 0.0040 | 1.75 | 0.00 | 0.10 | 25 | 0.125 | 1.52 | 0.921 | 1.72 | 0.13 |

| Examples•Comparative Examples | Inorganic layer | | | | Transparent conductive layer | | | Evaluation | | | |
|---|---|---|---|---|---|---|---|---|---|---|---|
| | Thickness TD (nm) | Thickness ratio TD/TC | Refraction nD | Refraction ratio nD/nC | Thickness TE (nm) | Thickness ratio TE/TD | Refraction nE | Crack suppression | Abrasion resistance | Transparency | Wiring pattern visibility suppression |
| Comparative Example 1 | — | — | — | — | 26 | — | 1.92 | x | ○ | ○ | ○ |

TABLE 2-continued

| | | | | | | | | | | | |
|---|---|---|---|---|---|---|---|---|---|---|---|
| Comparative Example 2 | 2 | 0.667 | 1.47 | 0.967 | 26 | 13 | 1.92 | ○ | x | x | ○ |
| Comparative Example 3 | 2 | 0.050 | 1.47 | 0.967 | 26 | 13 | 1.92 | ○ | x | ○ | x |
| Comparative Example 4 | 2 | 0.667 | 1.47 | 0.967 | 26 | 13 | 1.92 | ○ | ○ | x | ○ |
| Comparative Example 5 | 2 | 0.050 | 1.47 | 0.967 | 26 | 13 | 1.92 | ○ | ○ | ○ | x |
| Comparative Example 6 | 2 | 0.080 | 1.47 | 0.840 | 26 | 13 | 1.92 | ○ | ○ | x | x |
| Comparative Example 7 | 2 | 0.080 | 2.32*[3] | 1.526 | 26 | 13 | 1.92 | ○ | ○ | ○ | x |

*[3] $Nb_2O_5$

While the illustrative embodiments of the present invention are provided in the above description, such is for illustrative purpose only and it is not to be construed as limiting in any manner. Modification and variation of the present invention that will be obvious to those skilled in the art is to be covered by the following claims.

INDUSTRIAL APPLICABILITY

The transparent conductive film is used for, for example, a touch panel.

DESCRIPTION OF REFERENCE NUMERALS 1 transparent conductive film
2 transparent substrate
3 second optical adjustment layer
4 first optical adjustment layer
5 inorganic layer
6 transparent conductive layer
ABV absolute value (=|nC×1.13|)
nA refractive index (transparent substrate)
nB refractive index (second optical adjustment layer)
nC refractive index (first optical adjustment layer)
nD refractive index (inorganic layer)
TB thickness (second optical adjustment layer)
TC thickness (first optical adjustment layer)
TE thickness (transparent conductive layer)

What is claimed is:

1. A transparent conductive film comprising, in this order, a transparent substrate, a first optical adjustment layer, an inorganic layer, and a transparent conductive layer,
wherein the first optical adjustment layer has a refractive index lower than the refractive index of the transparent substrate and has a thickness of 10 nm or more and 35 nm or less,
a ratio of a thickness of the inorganic layer to a thickness of the first optical adjustment layer is 0.350 or less,
a ratio of a thickness of transparent conductive layer to the thickness of the inorganic layer is 5 or more, and
the inorganic layer has a refractive index, the refractive index being lower than or the same as the absolute value of a value obtained by multiplying the refractive index of the first optical adjustment layer by 1.13.

2. The transparent conductive film according to claim 1, further comprising a second optical adjustment layer disposed between the transparent substrate and the first optical adjustment layer,
wherein the second optical adjustment layer has a refractive index higher than the refractive index of the transparent substrate.

3. The transparent conductive film according to claim 2, wherein the second optical adjustment layer has a thickness of 100 nm or more and 300 nm or less.

4. The transparent conductive film according to claim 1, wherein the inorganic layer has a thickness of 1.5 nm or more and 10 nm or less.

5. The transparent conductive film according to claim 1, wherein the transparent conductive layer has a thickness of 25 nm or more.

6. The transparent conductive film according to claim 1, wherein the first optical adjustment layer consists of resin.

* * * * *